United States Patent
Li et al.

(10) Patent No.: US 9,735,137 B2
(45) Date of Patent: Aug. 15, 2017

(54) SWITCH CIRCUIT PACKAGE MODULE

(71) Applicant: Delta Electronics (Shanghai) Co., Ltd., Shanghai (CN)

(72) Inventors: Zeng Li, Shanghai (CN); Shou-Yu Hong, Shanghai (CN); Jian-Hong Zeng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 37 days.

(21) Appl. No.: 14/798,419

(22) Filed: Jul. 13, 2015

(65) Prior Publication Data

US 2015/0318234 A1   Nov. 5, 2015

Related U.S. Application Data

(63) Continuation of application No. 13/760,079, filed on Feb. 6, 2013, now Pat. No. 9,111,928.

(30) Foreign Application Priority Data

Oct. 31, 2012   (CN) .......................... 2012 1 0429620

(51) Int. Cl.
  *H01L 25/00* (2006.01)
  *H01L 23/495* (2006.01)
  (Continued)

(52) U.S. Cl.
  CPC ........ *H01L 25/50* (2013.01); *H01L 23/49562* (2013.01); *H01L 23/49589* (2013.01);
  (Continued)

(58) Field of Classification Search
  CPC . H01L 23/49537; H01L 25/071; H01L 25/50; H05K 1/141
  See application file for complete search history.

(56) References Cited

U.S. PATENT DOCUMENTS

| 5,859,632 | A | 1/1999 | Ito |
| 6,157,242 | A | 12/2000 | Fukui |
| 7,071,765 | B2 | 7/2006 | Kamijo |
| 7,248,483 | B2 | 7/2007 | West |

(Continued)

FOREIGN PATENT DOCUMENTS

| CN | 1812235 A | 8/2006 |
| CN | 101783587 A | 7/2010 |

(Continued)

*Primary Examiner* — Kenneth Parker
*Assistant Examiner* — Fang-Xing Jiang
(74) *Attorney, Agent, or Firm* — CKC & Partners Co., Ltd.

(57) ABSTRACT

A switch circuit package module includes at least a semiconductor switch unit and at least a first capacitor unit. The semiconductor switch unit includes a first semiconductor switch element and a second semiconductor switch element. The first semiconductor switch element and the second semiconductor switch element include a plurality of sub micro-switch elements. The capacitor unit includes a plurality of capacitors configured to cooperate with the sub micro-switch elements. The capacitors are arranged in a symmetrical distribution surrounded the semiconductor switch unit, such that impedances of any two symmetrical commutation loops each of which mainly consists of one capacitor and two sub micro-switch elements from the first semiconductor switch element and second semiconductor switch element respectively are close to or the same with each other.

5 Claims, 11 Drawing Sheets (51) Int. Cl.
*H01L 23/64* (2006.01)
*H01L 23/00* (2006.01)

(52) U.S. Cl.
CPC ............ *H01L 23/642* (2013.01); *H01L 24/73* (2013.01); *H01L 2224/32145* (2013.01); *H01L 2224/32245* (2013.01); *H01L 2224/33181* (2013.01); *H01L 2224/48091* (2013.01); *H01L 2224/48137* (2013.01); *H01L 2224/48247* (2013.01); *H01L 2224/73265* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/19041* (2013.01); *H01L 2924/19042* (2013.01); *H01L 2924/19104* (2013.01); *H01L 2924/19105* (2013.01); *H01L 2924/3011* (2013.01); *H01L 2924/30107* (2013.01)

(56) References Cited

U.S. PATENT DOCUMENTS

| | | | |
|---|---|---|---|
| 7,459,965 B2 | 12/2008 | Sugano | |
| 2004/0089934 A1* | 5/2004 | Shimoida | H01L 25/071 257/686 |
| 2009/0175014 A1* | 7/2009 | Zeng | H05K 1/141 361/782 |
| 2009/0256245 A1 | 10/2009 | Liu et al. | |
| 2011/0291236 A1* | 12/2011 | Hayashi | H01L 23/49537 257/532 |

FOREIGN PATENT DOCUMENTS

| | | |
|---|---|---|
| CN | 101820227 A | 9/2010 |
| CN | 101990709 A | 3/2011 |
| CN | 102739069 A | 10/2012 |
| TW | 200931777 A | 7/2009 |

* cited by examiner

SWITCH CIRCUIT PACKAGE MODULE

RELATED APPLICATIONS

This application is a continuation application of, and claims the benefit of, U.S. patent application Ser. No. 13/760,079, filed Feb. 6, 2013, titled "SWITCH CIRCUIT PACKAGE MODULE," and claims priority to Chinese Application Serial Number 201210429620.8, filed Oct. 31, 2012, which is herein incorporated by reference.

BACKGROUND

Field of Disclosure

The disclosure relates to a switch circuit. More particularly, the disclosure relates to a package module structure of a switch circuit.

Description of Related Art

In recent years, since both of industrial electronic products and general electronic products are required to have a lower power loss during the operation, it becomes an important issue that how to make the switch circuits in the electronic products work more efficiently so as to decrease the losses of the electronic products.

In the switch circuit, when different switches work alternately, a process of switching the switches will make the energy stored in a parasitic inductor on a commutation loop to be consumed on the circuit, and since the switch circuit generally has a higher switch frequency, a larger switch loss will be generated. In addition, if the switch circuit is made in the form of chip, then the switch circuit has a higher current harmonics, which will lead to a non-uniform distribution of the current on the chip, so as to generate an additional chip loss. Since a larger parasitic inductance in the loop often leads to non-ideal efficiency of the switch circuit, a capacitor is usually added into the switch circuit, so as to shrink an equivalent inductance and reduce the loss.

There are many conventional methods used to reduce the loss of the switch circuit. However, under a high frequency operating condition, the conventional methods can still lead to the problems such as apparent non-uniform distribution of the current on the chip due to the switch circuit having a higher current harmonics and low utilization of the chip due to the non-uniform distribution of the current when the switch is at a transient state.

SUMMARY

An aspect of the disclosure relates to a switch circuit package module including at least a semiconductor switch unit and at least a first capacitor unit. The semiconductor switch unit includes a first semiconductor switch element and a second semiconductor switch element. The first semiconductor switch element and the second semiconductor switch element include a plurality of sub micro-switch elements. The capacitor unit includes a plurality of capacitors. The capacitors are arranged in a symmetrical distribution surrounded the semiconductor switch unit, such that impedances of any two symmetrical commutation loops each of which mainly consists of one capacitor and two sub micro-switch elements from the first semiconductor switch element and second semiconductor switch element respectively are close to or the same with each other.

DETAILED DESCRIPTION

A detailed description is made hereinafter by taking embodiments and cooperating with the accompanying drawings. However, the embodiments described are not intended to limit the scope of the disclosure, while the description of a structural operation is not intended to limit the order of implementation. Any device with equivalent functions that is generated by a structure recombined by components shall fall into the scope of the disclosure. Additionally, the drawings are only used for illustration and are not drawn to scale.

As used herein, the terms "about", "approximately" or "roughly" generally refers to the error or scope of the quantity which is within a range of 20%, preferably within a range of 10%, and more preferably within a range of 5%. If no specific description is provided herein, then all the quantities mentioned herein are considered as approximate values, e.g., the error or scope being referred to by the terms "about", "approximately" or "roughly" or other approximate values.

Additionally, as used herein, both of the terms "couple" or "connect" can refer to the mutual physical contact or electrical contact performed directly or indirectly between two or more components. The terms "couple" or "connect" also can refer to the mutual operation or action between two or more components.

Figure 1A:
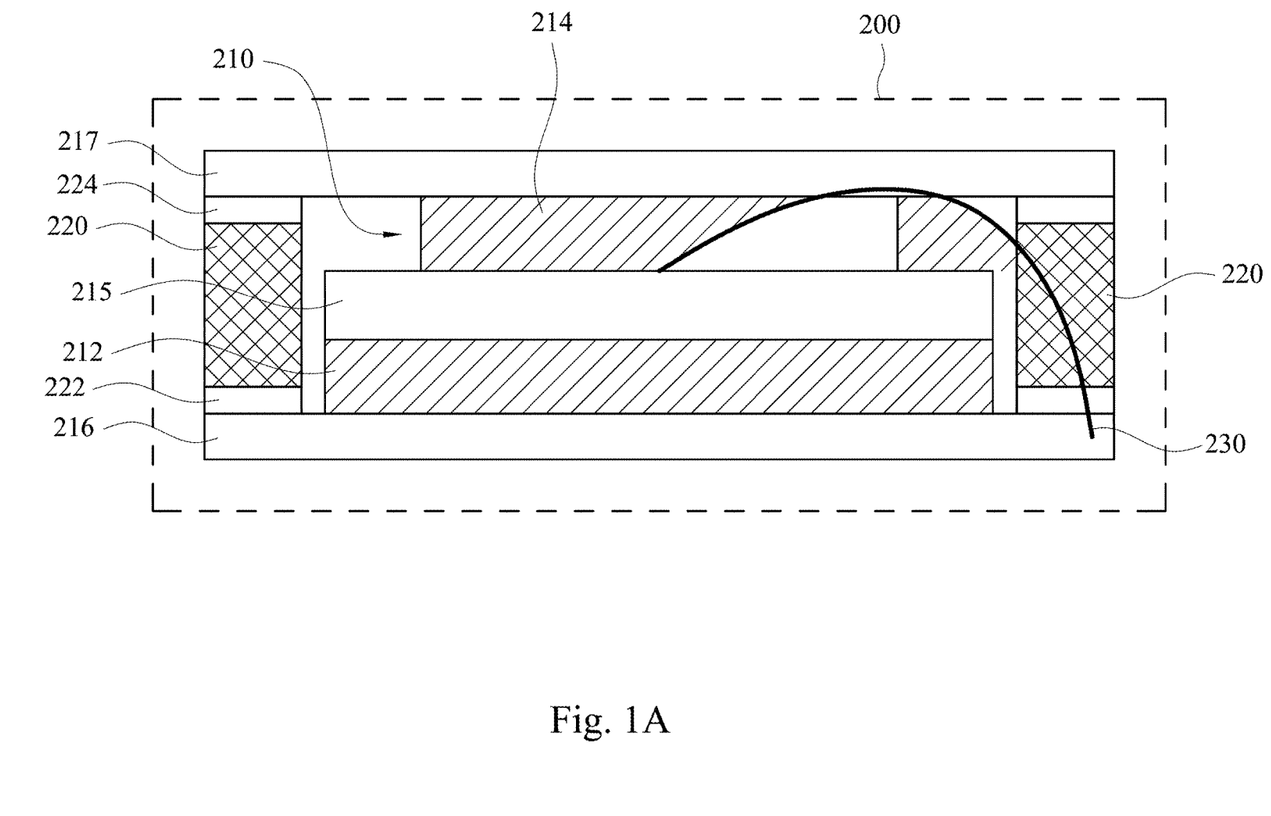
FIG. 1A is a schematic cross-section diagram illustrating a switch circuit package module according to an embodiment of the disclosure.
Figure 1B:
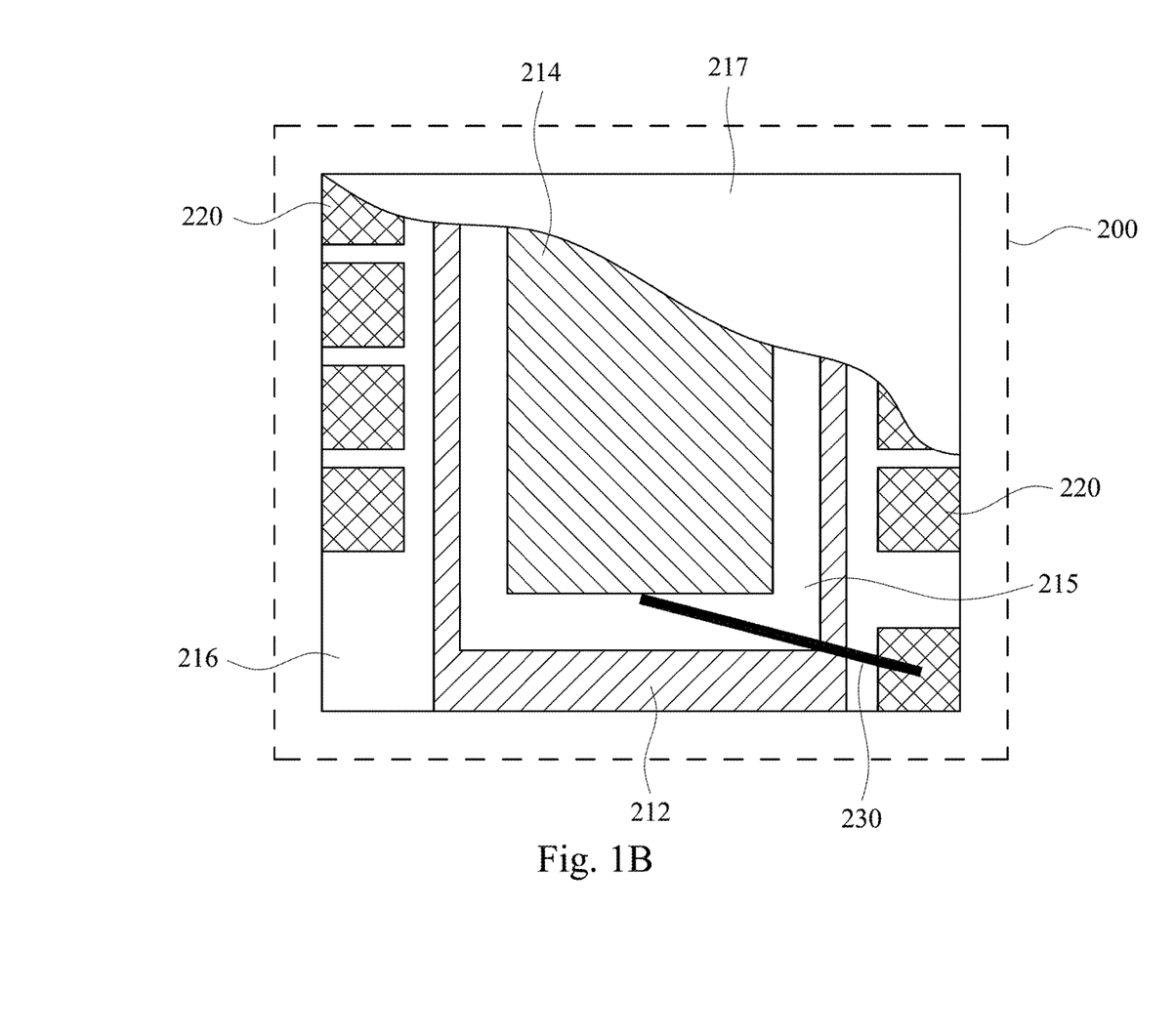
FIG. 1B is a schematic top diagram illustrating the switch circuit package module as shown in FIG. 1A according to an embodiment of the disclosure.

FIG. 1A is a schematic cross-section diagram illustrating a switch circuit package module according to an embodiment of the disclosure. FIG. 1B is a schematic top diagram illustrating the switch circuit package module as shown in FIG. 1A according to an embodiment of the disclosure. As shown in FIGS. 1A and 1B, a switch circuit package module 200 includes a first semiconductor switch element 212 and a capacitor unit (e.g., including multiple capacitors 220). The first semiconductor switch element 212 includes a plurality of sub micro-switch elements (the first semiconductor switch element 212 includes multiple cells, and each of which or multiple adjacent ones of which may be equivalent to one sub micro-switch element). The capacitor unit (e.g., including multiple capacitors 220) is configured to cooperate with the sub micro-switch elements. And the multiple capacitors 220 are arranged in symmetrical distribution surrounded the first semiconductor switch element 212. In the embodiment illustrated by FIG. 1A, the capacitors 220 stands up at two sides of the first semiconductor switch element such that impedances of any two symmetrical commutation loops each of which comprises one capacitor and two above-mentioned sub micro-switch elements in the first semiconductor switch element and the second semiconductor switch element respectively are close to or the same with each other.

Figure 1C:
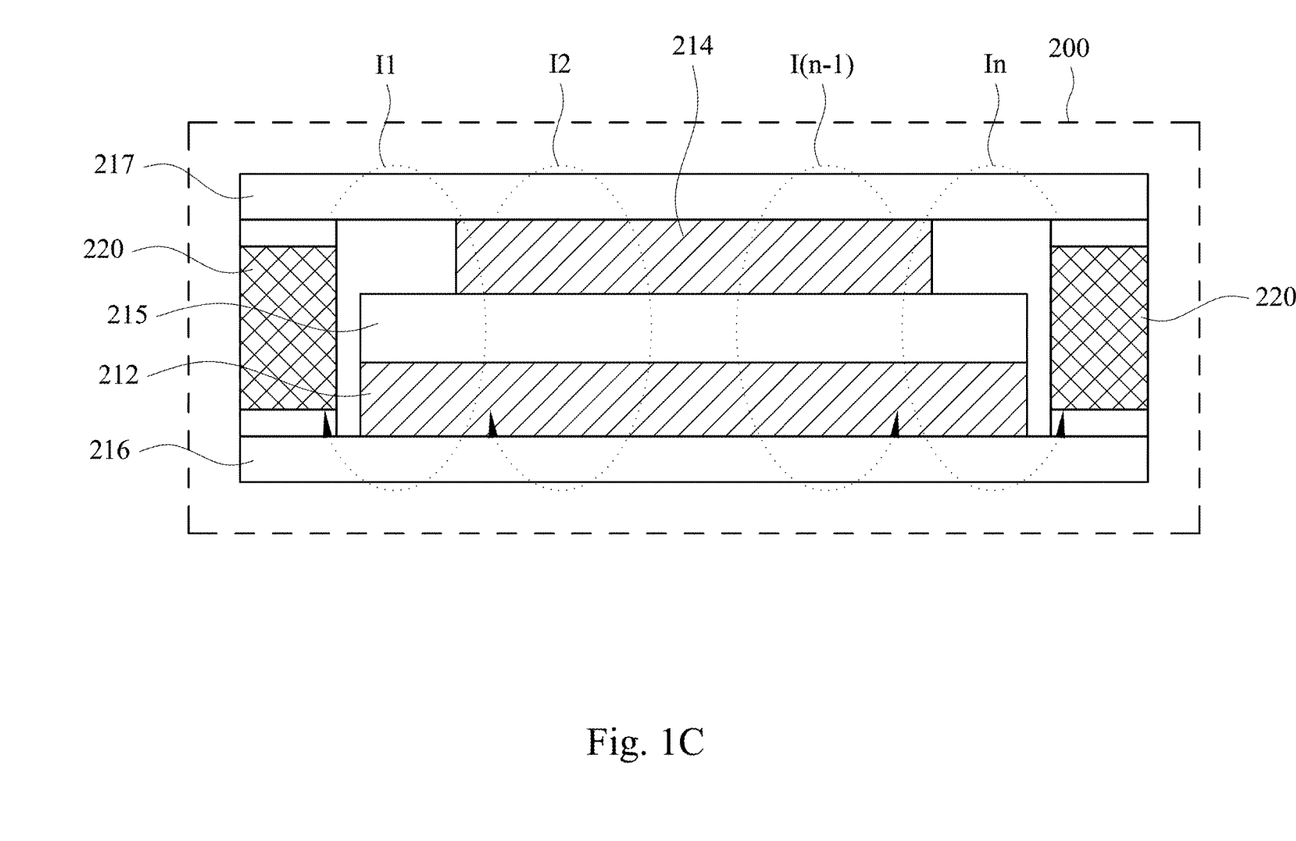
FIG. 1C is a schematic diagram illustrating the commutation loops in a switch circuit package module as shown in FIG. 1A according to an embodiment of the disclosure.

For example, FIG. 1C is a schematic diagram illustrating a commutation loop in the switch circuit package module as shown in FIG. 1A according to an embodiment of the disclosure. As shown in FIG. 1C, the capacitors 220 are arranged at both sides of the first semiconductor switch element 212, and the symmetrical commutation loops such as I1 and In, I2 and I(n−1), etc., are formed between the capacitors 220 at both sides and the sub micro-switch elements in the first semiconductor switch element 212, and the impedances of any two symmetrical commutation loops are close to or the same with each other.

Moreover, the switch circuit package module 200 may further include a second semiconductor switch element 214. The first semiconductor switch element 212 and the second semiconductor switch element 214 may be stacked to form a semiconductor switch unit 210, in which the capacitor units may be arranged at a periphery of the switch structure 210 (e.g., at both sides).

In practice, the first semiconductor switch element 212 may be a half bridge low side semiconductor switch chip, and the second semiconductor switch element 214 may be a half bridge high side semiconductor switch chip. Moreover, each of the above-mentioned capacitors 220 may be a separately packaged capacitor component. Alternatively, all the above-mentioned capacitors 220 may be packaged in a capacitor component. I.e., it can be implemented by one capacitor component having a larger capacitance.

Figure 1D:
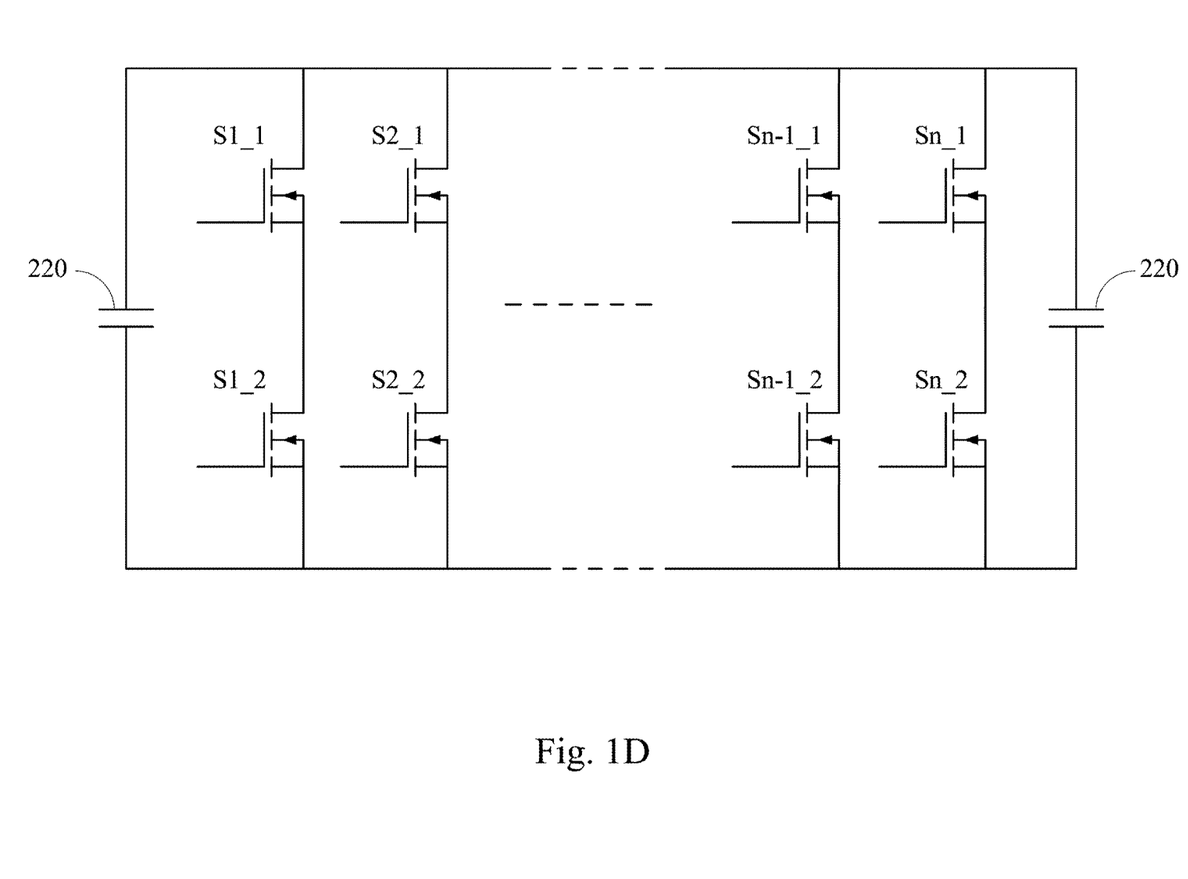
FIG. 1D illustrates a schematic diagram of a switch equivalent circuit of the switch circuit package module as shown in FIG. 1A according to an embodiment of the disclosure.

Next, if the first semiconductor switch element 212 and the second semiconductor switch element 214 are decomposed according to cell structure, then the switch circuit package module 200 may be equivalent to a switch equivalent circuit as shown in FIG. 1D. Specifically, according to the number of cells integrated into the chip and a packaged structure, corresponding to the capacitors 220 on both of the left and right sides, millions of the semiconductor cells in the chip may be divided into two cell groups (i.e., the left cell group an the right cell group). Both of the left and right parts may be one complete switch circuit respectively, and each complete switch circuit includes multiple sub high side semiconductor switches (e.g., S1_1 and S2_1) and multiple sub low side semiconductor switches (e.g., S1_2 and S2_2). Therefore, when the semiconductor cells of both of the left and right parts are driven by a gate signal to work simultaneously, the commutation loop may be shortened to about half of the original commutation loop.

In an embodiment, each of the first semiconductor switch element 212 and the second semiconductor switch element 214 has source, drain and gate. The first semiconductor switch element 212 is stacked with the second semiconductor switch element 214 and electrically connects with the second semiconductor switch element 214 in series. The drain of the first semiconductor switch element 212 is electrically connected with the source of the second semiconductor switch element 214. For example, the drain of the first semiconductor switch element 212 is electrically connected with the source of the second semiconductor switch element 214, and as shown in FIG. 1D, the connection relationship thereof may be that the drain of the sub low side semiconductor switch (e.g., S1_2 and S2_2) is electrically connected with the source of the sub high side semiconductor switch (e.g., S1_1 and S2_1).

In practice, both of the first semiconductor switch element 212 and the second semiconductor switch element 214 may be implemented by a MOSFET chip having a vertical structure which is perpendicular type of semiconductor switch chip. The MOSFET chip having the vertical structure has power electrodes (i.e., the drain and source) and a control electrode (gate), in which the drain and gate are configured on two different planes of the chip, for example the drain is located on the front plane of the chip and the source is configured on the back of the chip. Moreover, the switch circuit package module 200 may take a lead frame as a carrier and may be implemented by employing the form of quad flat no-lead (QFN) package. Next, the above-mentioned capacitors 220 may be multiple paralleled capacitors, each of which is configured with two terminals.

In another embodiment, the above-mentioned capacitor 220 may be configured with two terminals, and the two terminals are electrically connected with the source of the first semiconductor switch element 212 and the drain of the second semiconductor switch element 214 respectively. Specifically, as shown in FIG. 1A, the capacitor 220 may be configured with two capacitor electrodes 222 and 224. The electrode 222 is electrically connected with the source of the first semiconductor switch element 212 (e.g., both of the electrode 222 and the source of the first semiconductor switch element 212 being electrically connected with each other through a conductive layer 216), while the electrode 224 is electrically connected with the drain of the second semiconductor switch element 214 (e.g., both of the electrode 224 and the drain of the second semiconductor switch element 214 being electrically connected with each other through a conductive layer 217).

Next, an arrangement direction of the two electrodes of the above-mentioned capacitor unit (or the capacitors 220 therein) and a stacking direction of the first semiconductor switch element 212 and the second semiconductor switch element 214 may be identical with or vertical to each other. When the direction of the two electrodes are identical to the stacked direction of the two semiconductor switch elements, it shows the capacitor 220 stands up, otherwise the capacitor 220 lies down. For the stacked structure of the two semiconductor switch element, the way of standing up for the capacitor may keep the commutation loop as short as possible. For example, as shown in FIG. 1A, the arrangement direction of the two electrodes 222 and 224 of the capacitor 220 is mainly identical with the stacking direction of the first semiconductor switch element 212 and the second semiconductor switch element 214. However, the capacitor 220 also may be configured horizontally, such that the arrangement direction of the two electrodes 222 and 224 may be perpendicular to the stacking direction of the first semiconductor switch element 212 and the second semiconductor switch element 214.

Moreover, the switch circuit package module 200 may further include an intermediate conductive layer 215, a first conductive layer 216 and a second conductive layer 217. The intermediate conductive layer 215 is inserted between the first semiconductor switch element 212 and the second semiconductor switch element 214 to lead out a common electrode connected by both of the first semiconductor switch element and the second semiconductor switch element. Both of the first semiconductor switch element 212 and the above-mentioned capacitor unit (including the capacitors 220) are stacked on the first conductive layer 216 and electrically contacted with the first conductive layer 216. The second conductive layer 217 is stacked on the second semiconductor switch element 214 and the above-mentioned capacitor unit (including the capacitors 220) and electrically contacted with the second semiconductor switch element 214 and the above-mentioned capacitor unit (including the capacitors 220).

In operation, as shown in FIG. 1C, the currents I1, I2, . . . , I(n−1), In of the commutation loops respectively flow from the capacitors 220 at both sides through the second conductive layer 217, the second semiconductor switch element 214, the intermediate conductive layer 215, the first semiconductor switch element 212, the first conductive layer 216 and back to the capacitors 220.

In an embodiment, the intermediate conductive layer 215 may act as a switch point terminal, in other words, a common electrode which is connected with both of the first semiconductor switch element and the second semiconductor switch element. The first conductive layer 216 may act as a negative input terminal and be implemented by the lead frame. The second conductive layer 217 may act as a positive input terminal, and this positive input terminal may be led out onto the lead frame for being connected with an external circuit. In another embodiment, the above-mentioned capacitor unit (including the capacitors 220) may be soldered between the first conductive layer 216 and the second conductive layer 217 directly through the conductor (e.g., a copper sheet).

On the other hand, the capacitors 220 included in the above-mentioned capacitor unit may be symmetrically arranged at both sides of the stacked first and second semiconductor switch elements 212 and 214. For example, in FIG. 1B, the capacitors 220 are respectively configured on both of the left and right sides of the switch circuit package module 200 and arranged symmetrically to each other.

Furthermore, the switch circuit package module 200 may further include a drive connecting line 230. The drive connecting line 230 is connected with the second semiconductor switch element 214 by a wire bonding manner (as shown in FIG. 1A). In an embodiment, the drive connecting line 230 may be configured in the center of the second semiconductor switch element 214, away from input ends of the capacitors. In practice, the drive connecting line 230 may be connected to a corresponding lead on the lead frame through the wire bonding. It should be noted that, the above is only a brief and schematic description, and in actual, the switch circuit package module 200 also includes another drive connecting line connected with the first semiconductor switch element 212, and the specific connecting mode of the drive connecting line may be referred to FIG. 5.

Figure 2A:
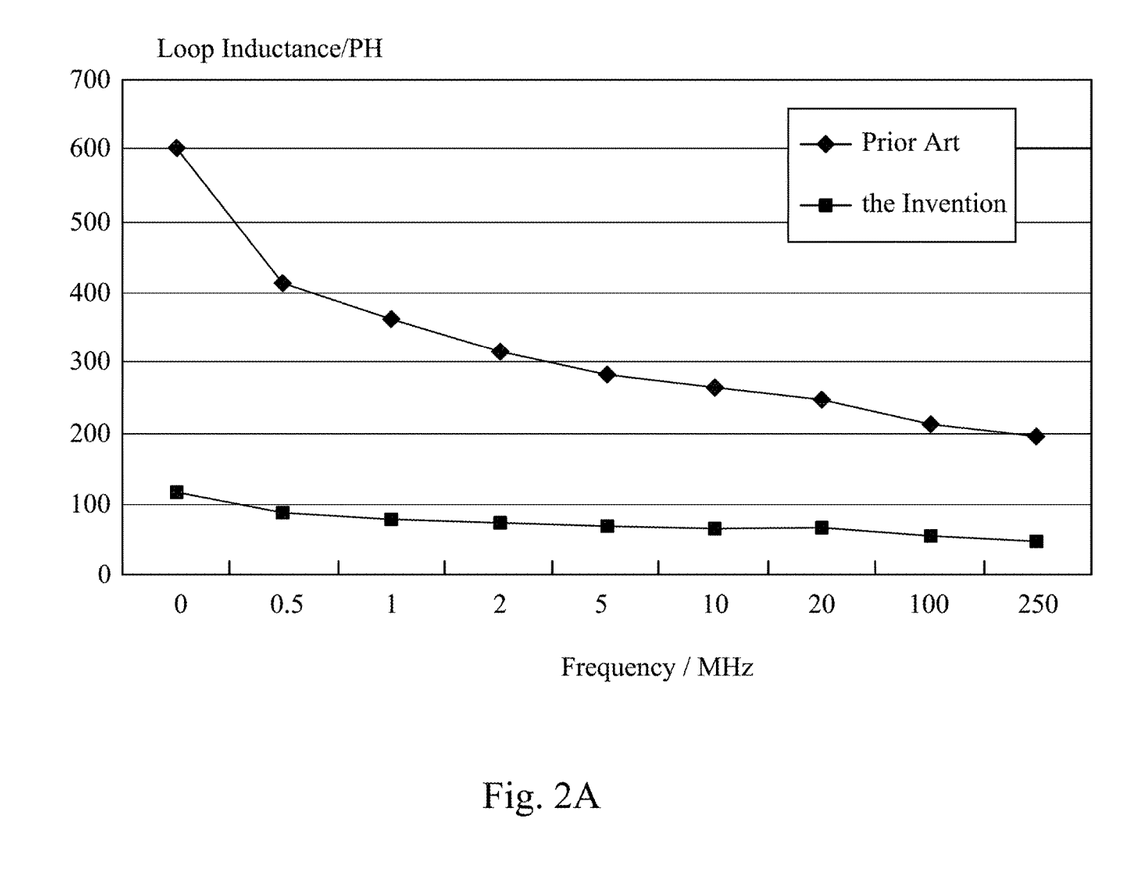
FIG. 2A illustrates a relation curve comparative diagram between frequencies and loop inductances of a switch circuit package module respectively using the embodiment of the disclosure and the prior art.
Figure 2B:
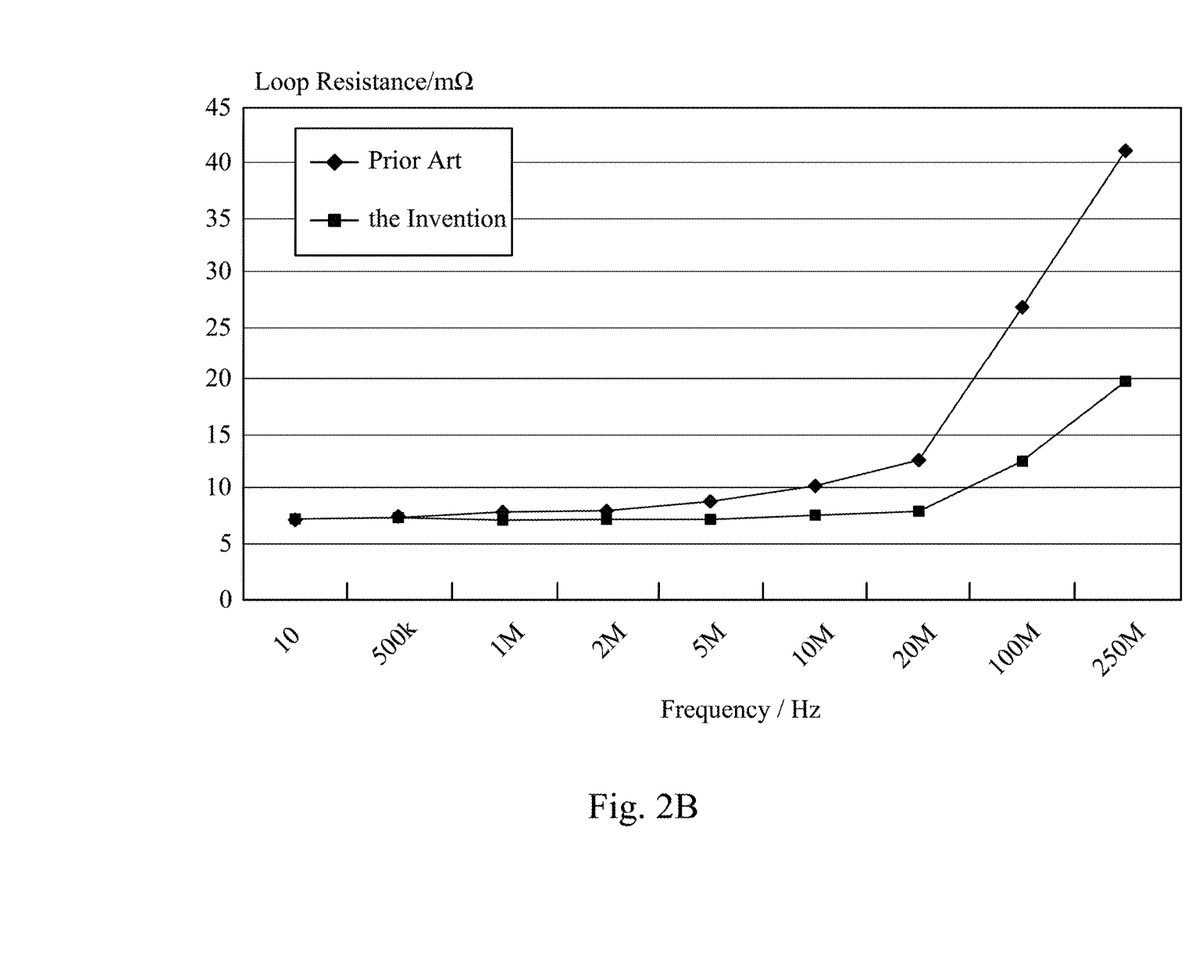
FIG. 2B illustrates a relation curve comparative diagram between frequencies and loop switch-on resistances of a switch circuit package module respectively using the embodiment of the disclosure and the prior art.

FIG. 2A illustrates a relation curve comparative diagram between the frequencies and the loop inductances of the switch circuit package module respectively using the embodiments of the disclosure and the prior art. It can be seen from FIG. 2A that, compared to the prior art, the loop inductances of the switch circuit package module using the embodiments of the disclosure may be reduced by about 40%. FIG. 2B illustrates a relation curve comparative diagram between the frequencies and the loop switch-on resistances of the switch circuit package module respectively using the embodiments of the disclosure and the prior art. It can be seen from FIG. 2B that, compared to the prior art, the loop switch-on resistances of the switch circuit package module using the embodiments of the disclosure may become smaller.

In view of the above, the switch circuit package module 200 shown in FIGS. 1A and 1B mainly has the following advantages:

1) a stack mode is employed in the semiconductor switch chip, such that the distance between the semiconductor switch chips may be reduced;

2) the capacitor is wireless and may be soldered with the semiconductor switch chip through the conductor (e.g., the copper sheet) directly, so as to reduce the distance between the semiconductor switch and the capacitor;

3) the capacitors are soldered at both sides of the semiconductor switch chip, such that the number of paralleled capacitors is easily increased, so as to increase the number of the commutation loops and reduce the distance which the current flows between the semiconductor switch and the capacitor;

4) the current on the switch circuit is distributed uniformly, such that the utilization of the switch is effectively enhanced; and 5) the drive connecting line may be configured in the central of the semiconductor switch chip, away from the input ends of the capacitors, so as to increase the drive speed of the semiconductor switch.

On the other hand, in the case that input capacitors are integrated into the switch circuit package module, when a harmonic frequency of a loop loop2 formed by external parasitic inductances and integrated capacitors is close to a frequency band having a larger amplitude in the pulse current of a loop loop1 in the switch circuit package module, a resonance may be generated in the circuit, and thus it is needed to select an appropriate capacitance according to parameters of parasitic components.

Figure 3A:
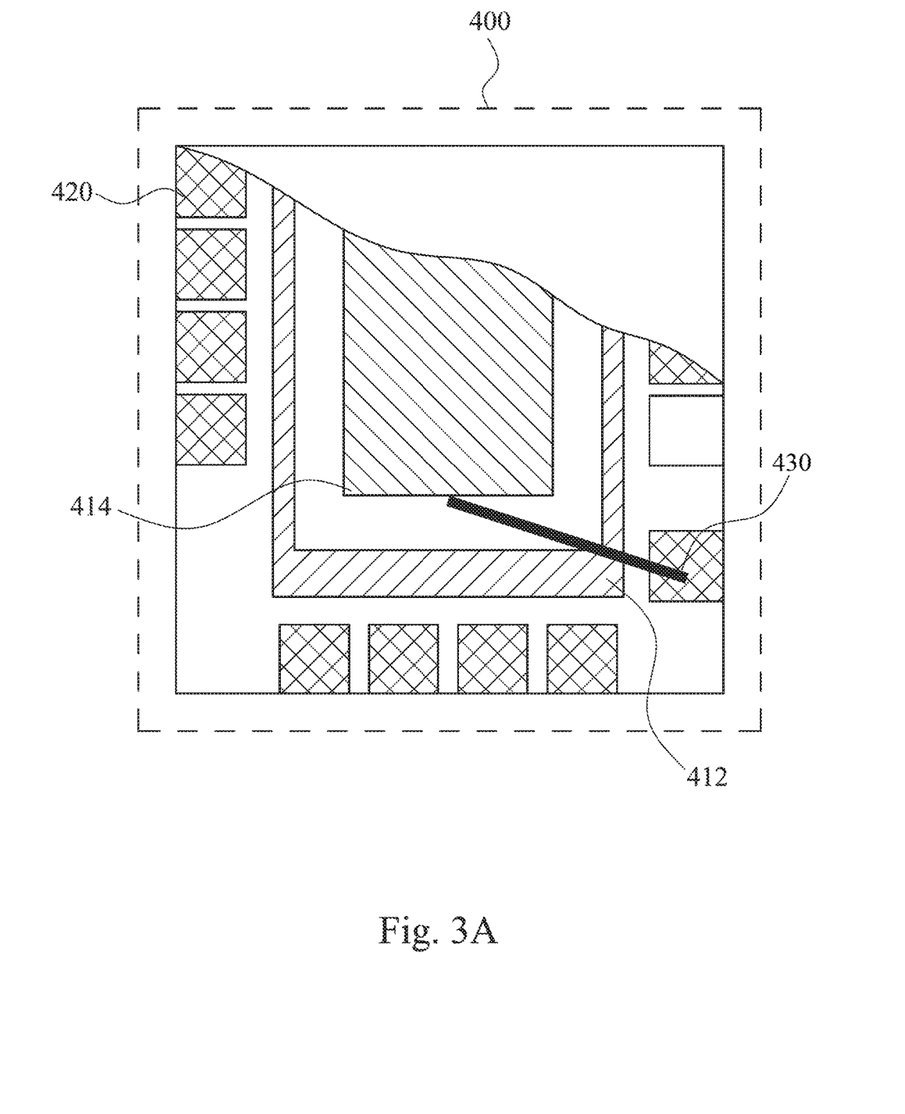
FIG. 3A is a schematic top diagram illustrating a switch circuit package module according to an embodiment of the disclosure.
Figure 3B:
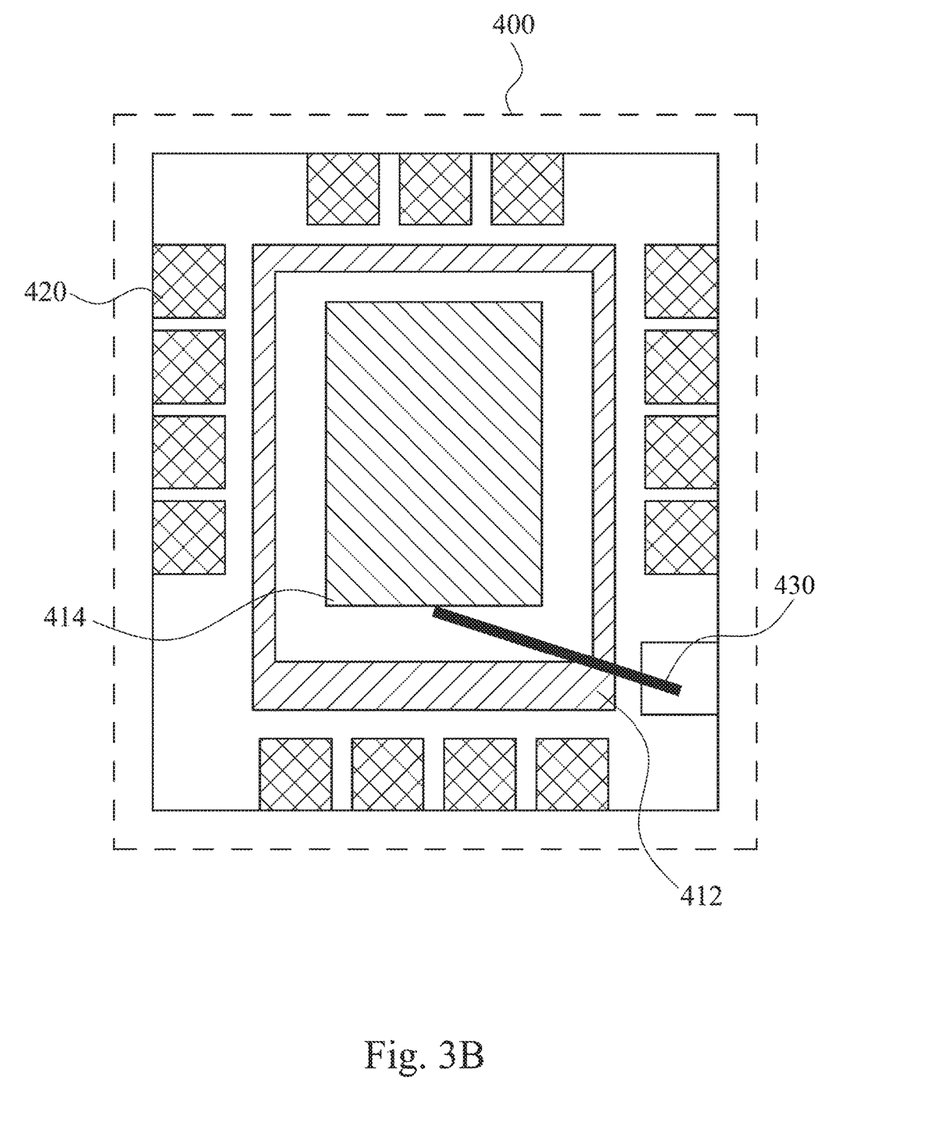
FIG. 3B is a schematic top diagram illustrating a switch circuit package module according to an embodiment of the disclosure.

FIG. 3A is a schematic top diagram illustrating a switch circuit package module according to an embodiment of the disclosure. As shown in FIG. 3A, a switch circuit package module 400 includes a first semiconductor switch element 412, a second semiconductor switch element 414, and the capacitor unit (e.g., including a plurality of capacitors 420). In this embodiment, a drive connecting line 430 is connected with the second semiconductor switch element 414 by a wire bonding manner. As shown in FIG. 3A, in the above-mentioned switch circuit package modules 200 or 400, the capacitors included in the capacitor unit may be configured along a third side (a downside of the switch structure as shown in FIG. 3A) of the switch structure adjacent to the switch structure, but is still in symmetrical distribution surrounded the semiconductor switch unit. FIG. 3B is a schematic top diagram illustrating a switch circuit package module according to an embodiment of the disclosure. In this embodiment, a drive connecting line 430 is connected with the second semiconductor switch element 414 by a wire bonding manner. As shown in FIG. 3B, in the above-mentioned switch circuit package modules 200 or 400, the capacitors included in the capacitor unit may be configured further along a fourth side of the switch structure opposing to the above-mentioned third side; i.e., the capacitors may be symmetrically arranged and configured along a periphery of the above-mentioned switch circuit package modules 200 or 400.

In view of the above, the above-mentioned capacitor unit may not only be configured on any two sides of the front side, back side, left side and right side of the switch structure (including the first semiconductor switch element and the second semiconductor switch element), but is still in symmetrical distribution surrounded the semiconductor switch unit. Furthermore, the above-mentioned capacitor unit may include capacitors having standard hexahedron form, and abnormal-shaped capacitors (e.g., the capacitors having a shape such as L shape and mouth shape) may also be employed. Next, in the case that the switch circuit package module is fabricated with the chip pattern, even if the chip is not rectangle, as long as the above-mentioned capacitor unit surrounds the semiconductor switch unit in symmetrical distribution, the switch circuit package module can have the effect similar to the aforementioned descriptions.

Figure 4A:
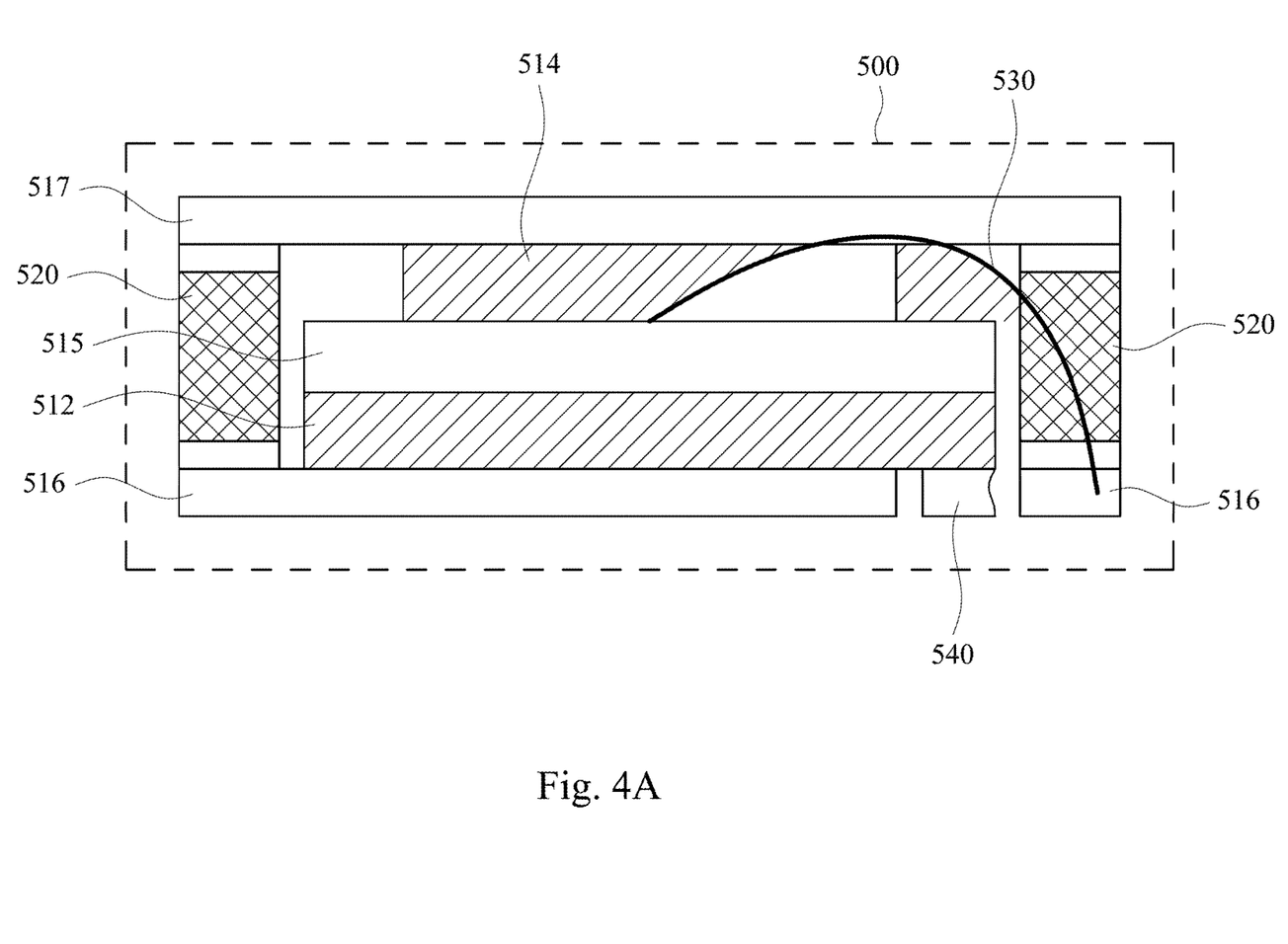
FIG. 4A is a schematic cross-section diagram illustrating a switch circuit package module according to an embodiment of the disclosure.

FIG. 4A is a schematic cross-section diagram illustrating a switch circuit package module according to an embodiment of the disclosure. As shown in FIG. 4A, a switch circuit package module 500 includes a first semiconductor switch element 512, a second semiconductor switch element 514, an intermediate conductive layer 515 (e.g., configured as the switch point terminal), a first conductive layer 516 (e.g., configured as the negative input terminal), a second conductive layer 517 (e.g., configured as the positive input terminal), a drive connecting line 530 and the capacitor unit (including at least two capacitors 520). The configuration and implementation of the switch circuit package module 500 are similar to the embodiment shown in FIG. 1A, which are not illustrated any further herein.

Compared to FIG. 1A, in this embodiment, the first semiconductor switch element 512 is a half bridge high side semiconductor switch chip, and the second semiconductor switch element 514 is a half bridge low side semiconductor switch chip. In practice, both of the first semiconductor switch element 512 and the second semiconductor switch element 514 may respectively be implemented by the MOSFET chip with the vertical structure. The gate and the source of the MOSFET chip employed by the first semiconductor switch element 512 are integrated on the same face of the chip, while the gate and the drain of the MOSFET chip employed by the second semiconductor switch element 514 are integrated on the same face of the chip and the source of the MOSFET chip is located at the other opposing face of the chip. Next, the corresponding drive connecting line of the first semiconductor switch element 512 may be led out by a corresponding output lead 540 on the lead frame.

For the embodiment shown in FIG. 4A, by using this switch circuit package module 500 it can be avoided that, when a relative large chip is employed by the half bridge low side switch and a relative small chip is employed by the half bridge high side switch, the relative large switch chip is overlapped above the relative small switch chip, such that the drive connecting line on the small chip is difficult to be led out and the process is difficult to be controlled, and the like.

Figure 4B:
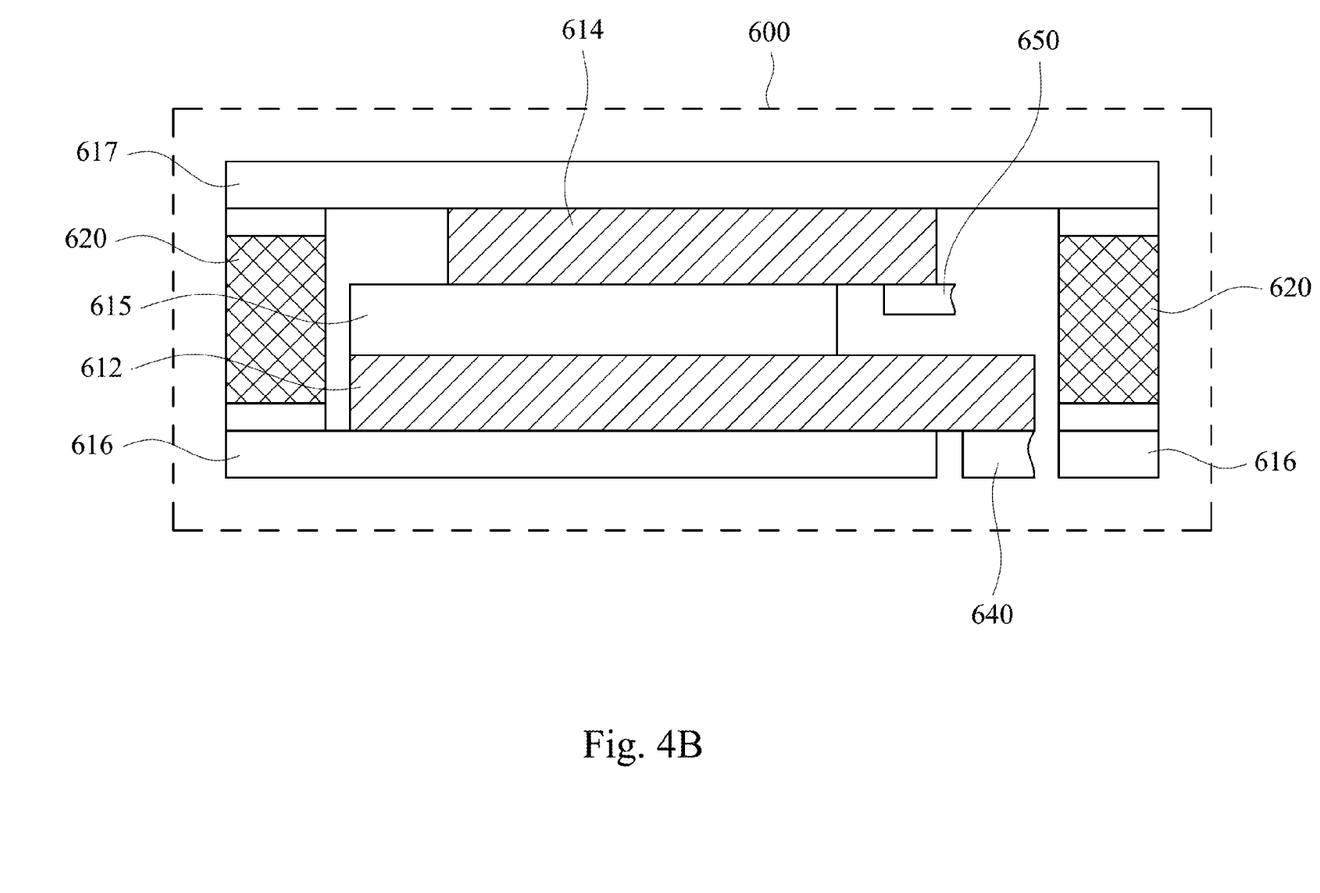
FIG. 4B is a schematic cross-section diagram illustrating a switch circuit package module according to an embodiment of the disclosure.

FIG. 4B is a schematic cross-section diagram illustrating a switch circuit package module according to a sixth embodiment of the disclosure. As shown in FIG. 4B, a switch circuit package module 600 includes a first semiconductor switch element 612, a second semiconductor switch element 614, an intermediate conductive layer 615 (e.g., as the switch point terminal), a first conductive layer 616 (e.g., as the negative input terminal), a second conductive layer 617 (e.g., as the positive input terminal) and the capacitor unit (including at least two capacitors 620). The configuration and implementation of the switch circuit package module 600 are similar to the embodiment shown in FIG. 4A, which are not illustrated any further herein.

In this embodiment, the switch circuit package module 600 further includes a drive lead 650. The drive lead 650 and the intermediate conductive layer 615 are arranged side by side and located between the first semiconductor switch element 612 and the second semiconductor switch element 614. The drive lead 650 is electrically contacted with the second semiconductor switch element 614, to serve as a drive line led out from the second semiconductor switch element 614. Moreover, an output lead 640 may also be led out similarly through the lead frame, to serve as the drive connecting line of the first semiconductor switch element 612.

In an embodiment, the above-mentioned control pin 650 may be implemented by a partially etched lead frame, and the functions of necessary insulation and electrical connection with the corresponding lead on the lead frame are achieved by the partially-etched lead frame. In another embodiment, the control pin 650 also may be implemented without the partially-etched lead frame, but implemented by performing a shift of a certain position for the first semiconductor switch element 612 and the second semiconductor switch element 614.

Figure 5:
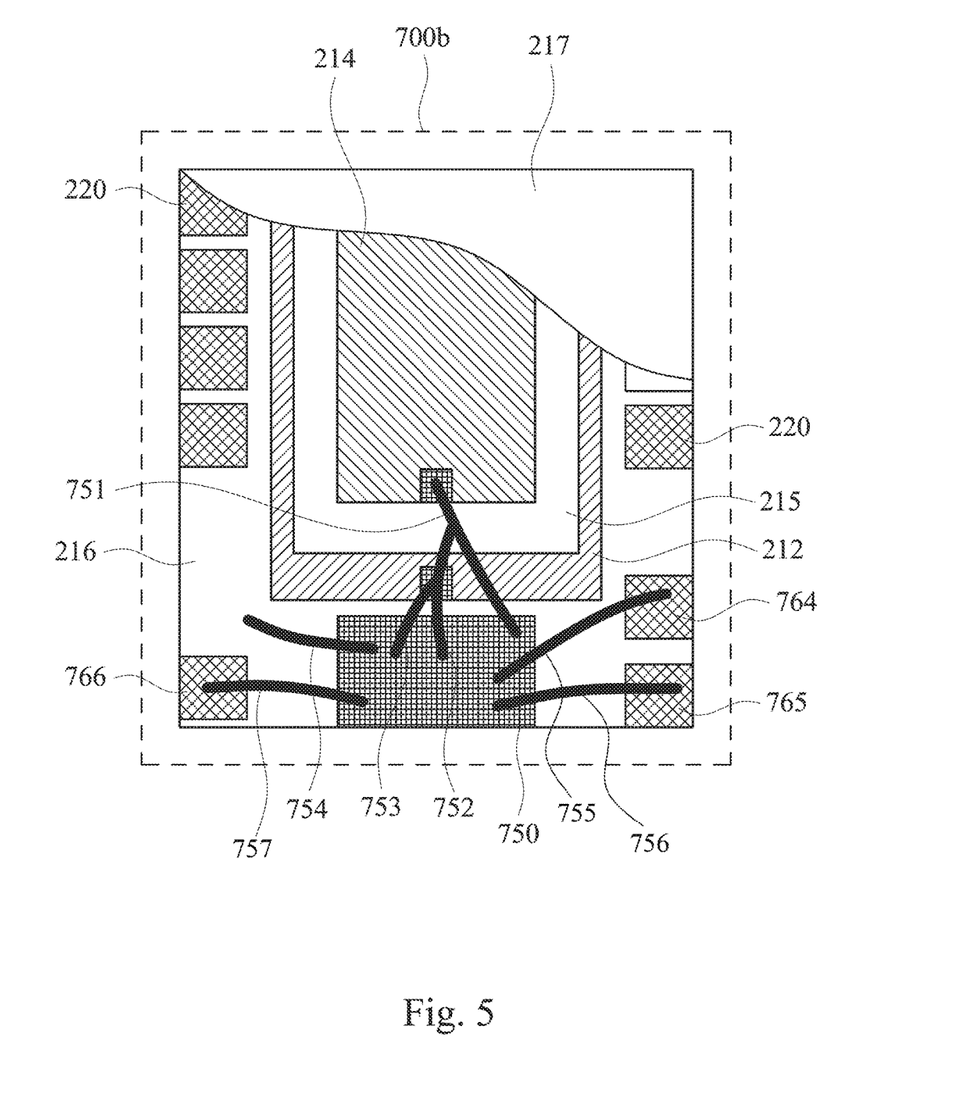
FIG. 5 is a schematic top diagram illustrating a switch circuit package module according to an embodiment of the disclosure.

FIG. 5 is a schematic top diagram illustrating a switch circuit package module according to an embodiment of the disclosure. Compared to FIG. 1B, a switch circuit package module 700b in this embodiment may further include a drive circuit unit 750. The drive circuit unit 750 is disposed at one side of the stacked package structure formed by the first semiconductor switch element 212 and the second semiconductor switch element 214, and electrically connected to the first semiconductor switch element 212 and the second semiconductor switch element 214. In this embodiment, the drive circuit unit 750 may be electrically connected to drive signal input terminals 764, 765 and 766 respectively through drive connecting lines 755, 756 and 757. The drive circuit unit 750 may be electrically connected with the second semiconductor switch element 214, the intermediate conductive layer 215, the first semiconductor switch element 212 and the first conductive layer 216 respectively through drive connecting lines 751, 752, 753 and 754, such that the drive circuit unit 750 may be operable to control the first semiconductor switch element 212 and the second semiconductor switch element 214.

Both of the above-mentioned first and second semiconductor switch elements may also be integrated together with the single MOSFET chip having a lateral structure except of being implemented with the MOSFET chip having the vertical structure, in which the gate, source and drain are integrated onto the same face of the MOSFET chip. Two semiconductor switches (MOSFET) of the half bridge high side and low side are integrated into the same chip by employing this kind of monolithic integration technology, such that the integration level between the two semiconductor switches (MOSFET) is enhanced, and thus the electrical performance of the system may be enhanced by a reasonable layout of the chip leads.

The sequence of all steps mentioned in this embodiment can be adjusted according to the actual requirements and they can even be performed simultaneously or partially simultaneously, except expressly specified otherwise in the above embodiment. The above is only an embodiment and is not intended to limit the disclosure.

Although the disclosure has been disclosed with reference to the above embodiments, these embodiments are not intended to limit the disclosure. It will be apparent to those of skills in the art that various modifications and variations can be made without departing from the spirit and scope of the disclosure. Therefore, the scope of the disclosure should be defined by the appended claims.

What is claimed is:

1. A switch circuit package module, comprising:
   at least a semiconductor switch unit comprising:
      a first semiconductor switch element comprising a plurality of sub micro-switch elements; and
      a second semiconductor switch element comprising a plurality of sub micro-switch elements; and
   at least a capacitor unit comprising a plurality of capacitors, wherein the capacitors are arranged in a symmetrical distribution surrounded the semiconductor switch unit, such that impedances of any two symmetrical commutation loops each of which mainly consists of one capacitor and two sub micro-switch elements from the first semiconductor switch element and second semiconductor switch element respectively are close to or the same with each other, wherein each of the first semiconductor switch element and the second semiconductor switch element has source, drain and gate, the first semiconductor switch element is stacked with the second semiconductor switch element and electrically connects with the second semiconductor switch element in series, both of the first semiconductor switch element and the second semiconductor switch element are perpendicular type of semiconductor switch chip which has source and drain in two different planes, each capacitor is configured with two terminals which are electrically connected with the source of the first semiconductor switch element and the drain of the second semiconductor switch element respectively.

2. The switch circuit package module of claim 1, further comprising:
   a first conductive layer for electrically connection between the first semiconductor switch element and the capacitor unit; and
   a second conductive layer for electrically connection between the second semiconductor switch element and the capacitor unit.

3. The switch circuit package module of claim 2, further comprising:
   an intermediate conductive layer inserted between the first semiconductor switch element and the second semiconductor switch element to lead out a common electrode connected by both of the first semiconductor switch element and the second semiconductor switch element.

4. The switch circuit package module of claim 1, wherein each capacitor surrounded the semiconductor switch unit stands up to keep each commutation loop as short as possible.

5. The switch circuit package module of claim 1, further comprising:
   a drive circuit unit near the semiconductor switch unit connected with gates of the first semiconductor switch element and the second semiconductor switch element.

* * * * *